US006829554B2

(12) United States Patent
Dueregger et al.

(10) Patent No.: US 6,829,554 B2
(45) Date of Patent: Dec. 7, 2004

(54) METHOD FOR CLASSIFYING COMPONENTS

(75) Inventors: Reinhard Dueregger, Poing (DE); Wolfgang Ruf, Friedberg (DE); Kapil Gupta, Munich (DE); Markus Sickmoeller, Dresden (DE)

(73) Assignee: Infineon Technologies AG, Munich (DE)

( * ) Notice: Subject to any disclaimer, the term of this patent is extended or adjusted under 35 U.S.C. 154(b) by 285 days.

(21) Appl. No.: 10/109,545

(22) Filed: Mar. 28, 2002

(65) Prior Publication Data

US 2003/0069726 A1 Apr. 10, 2003

(30) Foreign Application Priority Data

Mar. 28, 2001 (DE) .......................................... 101 15 280

(51) Int. Cl.[7] .................................................. G01K 5/00
(52) U.S. Cl. ....................... 702/130; 702/120; 714/718; 324/73.1; 324/760
(58) Field of Search ................................. 702/130, 117, 702/120, 99; 714/724, 737, 742, 736, 718; 324/760, 73.1

(56) References Cited

U.S. PATENT DOCUMENTS 4,483,629 A * 11/1984 Schwarz et al. ............... 374/57
4,871,963 A * 10/1989 Cozzi .......................... 209/573
5,030,905 A * 7/1991 Figal ........................... 324/760
5,642,307 A 6/1997 Jernigan ...................... 365/103
6,078,188 A 6/2000 Bannai et al. ............... 324/765
6,104,985 A * 8/2000 Sowards ..................... 702/117
6,130,442 A * 10/2000 Di Zenzo et al. ............. 257/48
6,313,652 B1 * 11/2001 Maeng ........................ 324/760
6,563,331 B1 * 5/2003 Maeng ........................ 324/760
6,681,361 B1 * 1/2004 Nakano ....................... 714/736

OTHER PUBLICATIONS

Infineon Data Sheet for HYB25D256400/800T/AT.S-DRAM, Nov., 2000.

* cited by examiner

Primary Examiner—John Barlow
Assistant Examiner—Hien Vo
(74) Attorney, Agent, or Firm—Fish & Richardson P.C.

(57) ABSTRACT

A method for classifying semiconductor components by their performance characteristics includes reading an identifier associated with a component and storing, in conjunction with the identifier, first and second performances values for that component. These performance values represent the component's achieved operating speed at each of two different temperatures. The component is then allocated to a speed category on the basis of the first and second performance values.

3 Claims, 1 Drawing Sheet

METHOD FOR CLASSIFYING COMPONENTS

FIELD OF INVENTION

The invention relates to a method for checking the functional capacity and operating characteristics of semiconductor components.

RELATED APPLICATIONS

This application claims the benefit of the priority date of German application 101 15 280.9, filed on Mar. 28, 2001, the contents of which are herein incorporated by reference.

BACKGROUND

Semiconductor components are tested with respect to their functional capacity. When the elements are being tested, both the temperature of the test environment and the maximum achievable operating speed of the semiconductor component are measurement parameters. In a first step, the so-called "low temp program", at a low temperature of e.g. −10° C., the semiconductor components are allocated to various categories with respect to their maximum achievable operating speed at the low temperature, and are distributed, in a handler, to various bins (containers). In this way, a plurality of bins with different speed classes are produced. The total number of all the semiconductor components distributed throughout the various bins may in this case lie between 5000 and 20,000.

In a second step, the various bins of semiconductor components are delivered individually to a "high temp program." In the "high temp program," they are re-tested with essentially the same procedures as in the "low temp program," but this time at a higher temperature of e.g. +85° C.

At the end of the two measurement procedures, the components are divided up into speed categories, with the components of a given category achieving a particular operating speed throughout the temperature range.

A disadvantage of this prior method is that the sorted components must not be mixed again after the low temp measurement. This entails considerable logistical complexity, since the individual bins need to be transported independently of one another, intermediately stored and tested separately in the "high temp program." Furthermore, one container needs to be disconnected and another needs to be connected up each time a new bin of semiconductor components is being docked to the test station for testing at a higher temperature. This results in a longer loading time for the handler and extra work for the operator. Furthermore, it is not possible to preclude the possibility that the individual bins may mistakenly be interchanged when an operator intervenes in the process.

SUMMARY

It is an object of the invention to provide a method which obviates the need for transportation and intermediate storage of semiconductor components that differ from one another only in terms of their maximum achievable operating speed, and which permits sorting of the components without human intervention.

The basic concept for achieving the foregoing object is to sort the components only logically according to speed classes in the "low temp program," without physically separating them from one another As a result, all the components are contained in one bin afterward, just as they were before. The distinction between the components is made by using information that is saved for each individual component in a file during the first test procedure, the "low temp program." The main aspect of the information about each component is the speed class to which it belongs. In addition, it is possible to store other parameters of the test measurement, such as e.g. the bin number, measuring instrument and the temperature. The file with the information about the different speed classes is saved on a server. The correlation between the data in the file on the server and the individual component is made possible by using the identification of the component. This identification is programmed into the component in a way that precludes erasure or alteration, and which is likewise stored in this file. During the "high temp" program, the file is imported and compared with the currently read chip identifications of the components. The information relating to the speed classes of the components from the "low temp program" and from the "high temp program" is subsequently combined, and only then are the components physically sorted.

The method on which the invention is based for classifying components includes recording a maximum achievable operating speed of each component at at least two temperature values, and allocating each component to a speed category as a function of the operating speed achieved by the component at the at least two temperature values.

In some practices of the invention, the following steps are carried out: reading the identification for each component, storing the operating speed achieved at a first temperature value in conjunction with the read identification for each component as an entry in a file in a database, repeating the preceding step for each further one of the at least two temperature values, and allocating each component to a speed category as a function of the operating speeds stored in the file in the database.

Preferably, the first of the at least two temperature values is the lowest temperature value, and each of the subsequent temperature values is higher than the temperature value preceding it.

In a preferred embodiment of the invention, the allocation of the component to one of the speed categories is carried out by determining the minimum of the operating speeds achieved at all of the at least two temperature values.

Other features and advantages of the invention are disclosed in the following description of a preferred exemplary embodiment.

DETAILED DESCRIPTION

Figure 1:
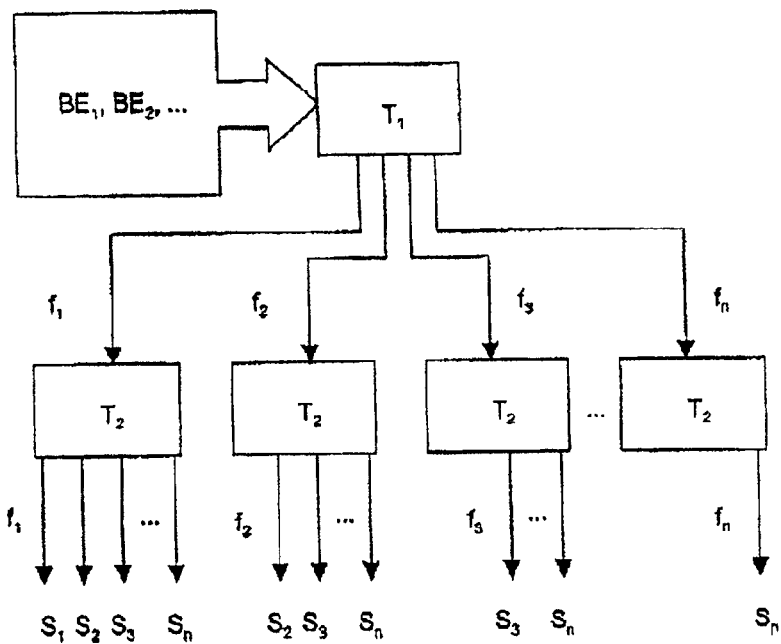
FIG. 1 shows the method according to the prior art.

In the method for classifying components according to the prior art, which is represented in FIG. 1, the components $BE_1$, $BE_2$, ... are tested at a first (low) temperature $T_1$, with respect to their maximum operating speed. To that end, test routines are carried out at various operating speeds $f_1, f_2, \ldots$ for each component $BE_1$, $BE_2$, . . . . If the respective component meets the test requirements for the highest operating speed $f_1$ at the first temperature value $T_1$, it is allocated to the $f_1$ category, i.e. it goes into an $f_1$ container.

Correspondingly, a component that meets the test requirements for the second-highest operating speed $f_2$ at the first temperature value $T_1$ is allocated to the $f_2$ category, i.e. it goes into an $f_2$ container. A component that meets the test requirements for the third-highest operating speed $f_3$ at the first temperature value $T_1$, is allocated to the $f_3$ category, i.e. it goes into an $f_3$ container, etc. This procedure continues until the "slowest" category is placed into an $f_n$ container.

Each of the foregoing containers is sent, after the measurement at the first temperature value $T_1$, to a measurement station. At the measurement station, the measurement is repeated at a second (higher) temperature value $T_2$.

After the measurement at this temperature value $T_2$, each component in the respective container is allocated to a speed category in the following way. Among the components sent in the $f_1$ container to the measurement at the higher temperature $T_2$, there may be certain components that also achieve the highest operating speed $f_1$ at the higher temperature. These components are allocated to the speed category $S_1$. Correspondingly, the components with the highest operating speed at the lower temperature and the second-highest operating speed at the higher temperature are allocated to the speed category $S_2$, etc.

Among the components that go in the (second-fastest) $f_2$ container from the measurement at the low temperature $T_1$ to the measurement at the higher temperature $T_2$, there may be components that also achieve the second-highest operating speed $f_2$ at the higher temperature; the possibility of achieving the highest operating speed is precluded. Similarly to the aforementioned allocation of the components from the $f_1$ container, these components are allocated to the speed category $S_2$. Correspondingly, the components with the second-highest operating speed at the lower temperature and the third-highest operating speed at the higher temperature are allocated to the speed category $S_3$, etc.

Figure 2:
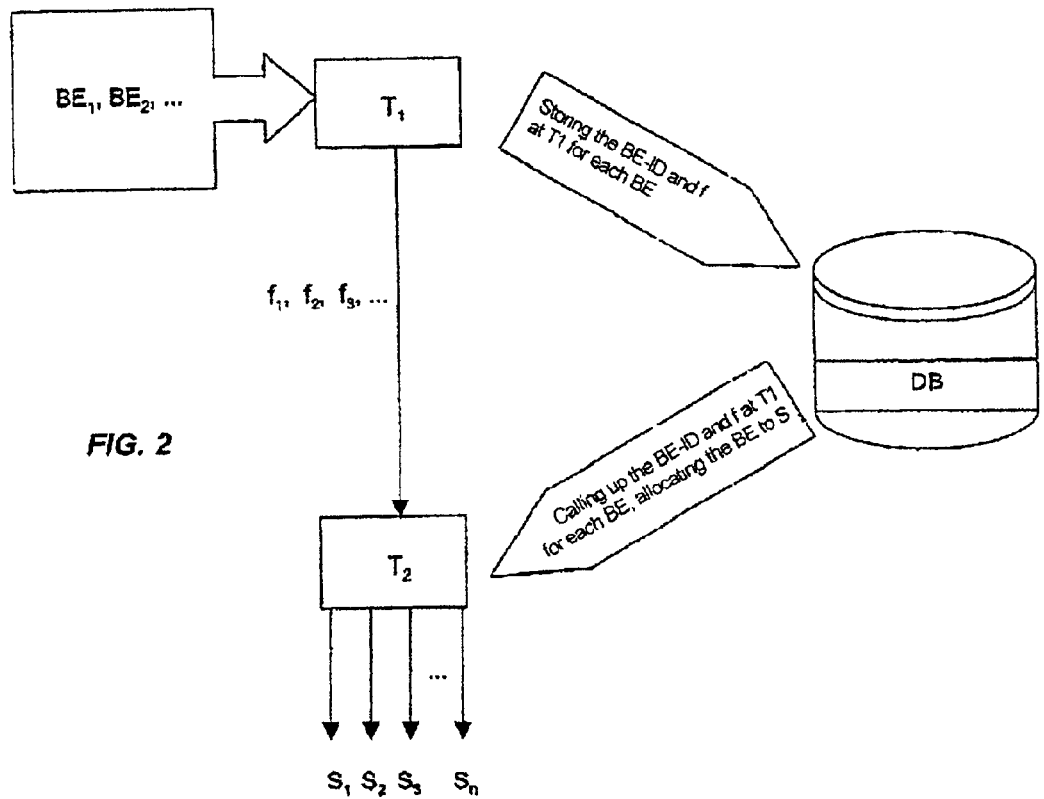
FIG. 2 shows an embodiment of the method according to the invention.

In order to avoid sorting and separating the components $BE_1$, $BE_2$, . . . into the respective containers between the test stations $T_1$ and $T_2$ for the different temperatures, as well as transporting and intermediately storing the components, the method as shown in FIG. 2 is carried out.

In the method according to FIG. 2, the identification of each of the components is read before the first test (at the lowest temperature $T_1$). These component identifications $BE\text{-}ID_1$, $BE\text{-}ID_2$, . . . are respectively programmed, uniquely and in such a way that they cannot be erased or altered, in the semiconductor component. As a result, each semiconductor component can be identified by using its component identification $BE\text{-}ID_1$, $BE\text{-}ID_2$, . . . After the identification $BE\text{-}ID_1$, $BE\text{-}ID_2$, . . . of each component $BE_1$, $BE_2$, . . . has been read, the identification is used as the label of a data record that is assigned to each of the components $BE_1$, $BE_2$, . . . in a database DB. The operating speed $f_1$, $f_2$, . . . or $f_n$ achieved at the first temperature value $T_1$ is then written into this data record of a component, so that each of the components $BE_1$, $BE_2$, . . . can have its operating speed allocated uniquely to it by using its identification $BE\text{-}ID_1$, $BE\text{-}ID_2$, . . . $BE\text{-}ID_n$.

The writing of the respectively achieved operating speed into the data record of a tested component is repeated for each further measurement with a modified temperature value $T_1$, $T_2$, . . . , until all the test runs have been completed. In this case, it is possible to access the special fields of the data record, which are allocated to the component, by using the identification $BE\text{-}ID_1$, $BE\text{-}ID_2$, . . . .

After completion of all the test series, each component $BE_1$, $BE_2$, . . . is allocated to one of the speed categories $S_1$, $S_2$, . . . as a function of the operating speeds $f_1$, $f_2$, . . . stored in the file in the database for the respective component.

An example of the structure and the management of a file with entries for the components $BE_1$ to $BE_n$ will be explained below. In this example, distinction is made between four operating speeds $f_1$, $f_2$, $f_3$, $f_4$. Six arbitrary components were picked out.

After the first measurement at a temperature $T_1$, the file preferably has the following form:

TABLE 1

| Component | f1 | f2 | f3 | f4 |
|---|---|---|---|---|
| 123456 | ✓ | ✓ | ✓ | ✓ |
| 456123 | ● | ● | ✓ | ✓ |
| 987321 | ● | ● | ● | ● |
| 159753 | ● | ✓ | ✓ | ✓ |
| 357465 | ✓ | ✓ | ✓ | ✓ |
| 852456 | ● | ● | ● | ✓ |
| . . . | | | | |

In Table 1, the symbol "✓" means that the component is suitable for the operating speed $f_1$, $f_2$, $f_3$ or $f_4$ (at the measurement temperature $T_1$), and the symbol "●" means that the component is unsuitable for the corresponding operating speed.

After the characteristics of the components have been measured at the second temperature $T_2$, the following table is correspondingly obtained for the same components:

TABLE 2

| Component | f1 | f2 | f3 | f4 |
|---|---|---|---|---|
| 123456 | ●✓ | ●✓ | ✓✓ | ✓✓ |
| 456123 | ●● | ●● | ✓✓ | ✓✓ |
| 937321 | ●● | ●● | ●● | ●● |
| 159753 | ●● | ●✓ | ●✓ | ●✓ |
| 357465 | ✓✓ | ✓✓ | ✓✓ | ✓✓ |
| 852456 | ●● | ●● | ●● | ✓✓ |
| . . . | | | | |

In the method according to the invention, the allocation of the components to one of the speed categories is preferably carried out by determining the minimum of the operating speeds $f_1$, $f_2$, $f_3$ or $f_4$ achieved at the two temperature values $T_1$ and $T_2$. It is straightforward to find the maximum operating speed achievable throughout the temperature range by taking the symbol "✓" as 1 and the symbol "●" as 0. If the two symbols are multiplied with one another and with the value directly above in the first row, the relevant operating speed f is obtained. In the above tables 1 and 2, for instance, 0, 0, f3, f4 are found as the achieved operating speed for the component 123456. The relevant operating speed is therefore f3. Similarly, f1 is obtained as the relevant operating speed for the component 357465, f2 as the relevant operating speed for the component 456123, etc. The ranking of the components from Table 2 in terms of the speed classes is represented in Table 3 below.

TABLE 3

| Component | f1 | f2 | f3 | f4 | |
|---|---|---|---|---|---|
| 357465 | ✓✓ | ✓✓ | ✓✓ | ✓✓ | S1 |
| . . . | | | | | |
| . . . | | | | | S2 |
| 123456 | ●✓ | ●✓ | ✓✓ | ✓✓ | S3 |
| . . . | | | | | |

TABLE 3-continued

| Component | f1 | f2 | f3 | f4 | |
|---|---|---|---|---|---|
| 456123 | ●● | ●● | ✓✓ | ✓✓ | |
| ... | | | | | |
| 852456 | ●● | ●● | ●● | ✓✓ | S4 |
| ... | | | | | |
| 159753 | ●● | ●✓ | ●✓ | ●✓ | no allocation |
| ... | | | | | |
| 987321 | ●● | ●● | ●● | ●● | |
| ... | | | | | |

In contrast to the prior art, in which sorting is already carried out physically between the "low temp" measurement and the "high temp" measurement, the invention provides for sorting only logically at this level. The actual physical segregation of components by operating speed does is delayed until the very end of the test procedures.

Preferably, the method is carried out in such a way that the first temperature value $T_1$ is the lowest temperature value, and each of the subsequent temperature values is higher than the temperature value preceding it.

Having described the invention, and a preferred embodiment thereof, what we claim as new, and secured by letters patent is:

1. A method for classifying components which each have a unique identification, with the following steps:
   recording a maximum achievable operating speed of each component at at least two temperature values and
   allocating each component to a speed category as a function of the operating speed achieved by the component at the at least two temperature values,
   which method has the following steps:
   reading the identification for each component,
   storing the operating speed achieved at a first temperature value in conjunction with the read identification for each component as an entry in a file in a database,
   repeating the preceding step for each further one of the at least two temperature values,
   allocating each component to a speed category as a function of the operating speeds stored in the file in the database.

2. The method as claimed in claim 1, wherein the first of the at least two temperature values is the lowest temperature value of the at least two temperature values, and each of the subsequent temperature values is higher than the temperature value preceding it.

3. The method as claimed in claim 1, wherein the allocation is carried out by determining the minimum of the operating speeds achieved at all of the at least two temperature values.

* * * * *